(12) United States Patent
Fournel et al.

(10) Patent No.: US 12,532,717 B2
(45) Date of Patent: *Jan. 20, 2026

(54) CATIONIC ELEMENTS-ASSISTED DIRECT BONDING METHOD

(71) Applicant: COMMISSARIAT À L'ENERGIE ATOMIQUE ET AUX ENERGIES ALTERNATIVES, Paris (FR)

(72) Inventors: Frank Fournel, Grenoble (FR); Aziliz Calvez, Grenoble (FR); Vincent Larrey, Grenoble (FR); Christophe Morales, Grenoble (FR)

(73) Assignee: COMMISSARIAT À L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 438 days.

This patent is subject to a terminal disclaimer.

(21) Appl. No.: 18/316,338

(22) Filed: May 12, 2023

(65) Prior Publication Data

US 2023/0386891 A1  Nov. 30, 2023

(30) Foreign Application Priority Data

May 25, 2022  (FR) ..................... 22/05053

(51) Int. Cl.
 *H01L 21/762* (2006.01)
 *H01L 21/02* (2006.01)
 *H01L 21/324* (2006.01)
(52) U.S. Cl.
 CPC ........ *H01L 21/762* (2013.01); *H01L 21/0206* (2013.01); *H01L 21/324* (2013.01)

(58) Field of Classification Search
None
See application file for complete search history.

(56) References Cited

U.S. PATENT DOCUMENTS

2006/0141746 A1  6/2006  Delattre et al.
2006/0273068 A1  12/2006  Maunand Tussot et al.
(Continued)

FOREIGN PATENT DOCUMENTS

FR  2 880 186 A1  6/2006
FR  3102771 A1  5/2021
(Continued)

OTHER PUBLICATIONS

U.S. Appl. No. 18/198,390, filed May 17, 2023 in the name of Fournel et al.
(Continued)

*Primary Examiner* — Michael Lebentritt
(74) *Attorney, Agent, or Firm* — Oliff PLC

(57) ABSTRACT

A method for manufacturing a multilayer structure by direct bonding between a first substrate and a second substrate, the method including the steps of: providing a first substrate and a second substrate respectively including a first bonding surface and a second bonding surface, contacting the first bonding surface and the second bonding surface so as to create a direct bonding interface between the first substrate and the second substrate, placing at least the direct bonding interface in a cationic aqueous solution including deionized water and cationic species originating from at least one element of the first and/or of the second column of the periodic table of elements, and applying a heat treatment at a temperature comprised between 20° C. and 350° C. so as to obtain the multilayer structure.

9 Claims, 1 Drawing Sheet

(56) References Cited

U.S. PATENT DOCUMENTS

| | | | |
|---|---|---|---|
| 2018/0095067 A1* | 4/2018 | Huff | G01N 33/48721 |
| 2018/0297341 A1* | 10/2018 | Ueki | G02F 1/1335 |
| 2020/0392040 A1 | 12/2020 | Acquard et al. | |
| 2023/0386891 A1 | 11/2023 | Fournel et al. | |
| 2024/0190105 A1 | 6/2024 | Namikawa et al. | |

FOREIGN PATENT DOCUMENTS

| | | | | |
|---|---|---|---|---|
| JP | 6286078 B2 * | 2/2018 | | H01L 21/2007 |
| JP | WO2020032284 A1 | 8/2021 | | |
| WO | WO-2017160961 A1 * | 9/2017 | | H01M 8/1062 |
| WO | WO-2019202067 A1 * | 10/2019 | | H01L 21/2007 |
| WO | 2021/084188 A1 | 5/2021 | | |

OTHER PUBLICATIONS

U.S. Appl. No. 18/196,184, filed May 11, 2023 in the name of Fournel et al.
Sep. 19, 2025 Office Action issued in U.S. Appl. No. 18/198,390.

* cited by examiner

CATIONIC ELEMENTS-ASSISTED DIRECT BONDING METHOD

The present invention relates to the field of direct bonding. It concerns in particular a method for manufacturing a multilayer structure by direct bonding.

The direct bonding is a technique well known now and used for industrial applications such as the manufacture of SOI by the company SOITEC or the company STMicroelectronics for the production of imagers for example. As understood in this document, direct bonding is spontaneous bonding between two surfaces without adding material to the interface between the bonded surfaces, and in particular without a thick layer of liquid. It is nevertheless possible to have some monolayers of water adsorbed on the surfaces, which represents between 0.25 nm and 1.25 nm in thickness, so that these surfaces are macroscopically dry.

The direct bonding is conventionally carried out at ambient temperature and ambient pressure, but this is not an obligation.

An important characteristic of direct bonding is its adhesion energy, that is to say the energy available to achieve spontaneous bonding. This is the energy that allows the two surfaces to be deformed to bring them into contact at the atomic scale so that the Van der Waals forces can be implemented. For example, for two surfaces of silicon or hydrophilic silicon oxide, the adhesion energy typically ranges from 30 to 100 mJ/m$^2$. This adhesion energy partly directs the duration of the propagation of the bonding wave, for example the bonding wave propagates in a conventional way in 9 seconds for the direct bonding of two 200 mm silicon substrates.

Another important characteristic of direct bonding is its adherence energy or otherwise called its bonding energy. This is the energy that must be used to separate the two bonded surfaces. For example, for two surfaces of silicon or hydrophilic silicon oxide, the adherence energy typically ranges from 0.14 J/m$^2$ to 6 J/m$^2$.

To obtain spontaneous bonding, the surfaces are generally cleaned of organic and particulate contamination which is very detrimental to direct bonding. In general, cleaning is carried out beforehand on the surfaces to be bonded with a Caro acid-based solution obtained with a mixture of 96% sulfuric acid and 30% hydrogen peroxide (3:1) at 180° C. and SC1 (mixture of 30% ammonia, 30% hydrogen peroxide and deionized water (1:1:5)) at 70° C. Alternatively, it is possible to use other highly oxidizing cleaning solutions such as, for example, aqueous solutions containing ozone or else with a treatment using exposure to UV light in the presence of gaseous ozone. The adherence energy of a SiO2-SiO2 bonding (two silicon substrates covered with approximately 145 nm of thermal oxide for example), in a clean room environment, with Caro and SCl-based chemical cleaning at 70° C., is about 140 mJ/m$^2$ just after the bonding, without heat treatment.

The bonding energy also evolves according to the heat treatment that is applied after the bonding carried out at ambient temperature. The adherence energy increases as a function of the temperature of the heat treatments. For example, the $SiO_2$—$SiO_2$ bonding energy rises slowly to reach, depending on the surface treatment, almost 3 J/m$^2$ at 500° C. and then stagnates up to 800° C.

To further increase the bonding energy, another solution consists in carrying out a plasma treatment prior to contacting. With a nitrogen ($N_2$) plasma, for oxide-oxide bonding, the bonding energy rises rapidly to approximately 5 J/m$^2$ for a treatment temperature of 300° C.

However, the use of a plasma may be incompatible with certain substrates and/or its use lengthens the times and/or costs of the methods, which makes them more difficult to industrialize. The plasma treatment also modifies the surface over a thickness of a few nanometers (between 1 and 10 nm). This change may affect future devices. For example, with a silicon plate, the plasma creates an oxide layer which is difficult to be controlled in terms of thickness and quality. With a silicon oxide surface, certain plasmas such as the N2 plasma create interfacial charge problems that can disrupt the electrical operation of future devices.

One of the aims of the present invention is to remedy the drawbacks of the prior art. To this end, the present invention proposes a method for manufacturing a multilayer structure by direct bonding between a first substrate and a second substrate, the method comprising the steps of:

a) providing a first substrate and a second substrate respectively comprising a first bonding surface and a second bonding surface, b) contacting the first bonding surface and the second bonding surface so as to create a direct bonding interface between the first substrate and the second substrate, c) depositing at least the direct bonding interface in a cationic aqueous solution comprising deionized water and cationic species from at least one element of the first and/or second column of the periodic table of elements, and d) applying a heat treatment at a temperature comprised between 20° C. and 350° C. so as to obtain the multilayer structure.

This direct bonding method thus produced makes it possible to obtain a multilayer structure having a bonding energy greater than that of a multilayer structure obtained by a direct bonding method devoid of the treatment step c) in an aqueous cationic solution. A high bonding energy is then obtained at low temperature, that is to say at temperatures below 400° C., preferably below or equal to 350° C. and even more preferably at a temperature of 200° C.

These bonding temperatures are compatible with numerous applications and/or with numerous substrates, whose nature and/or the presence of electronic and/or opto-electronic components require low thermal budgets. In addition, the method is applicable to many materials and is inexpensive. The method leads to multilayer structures having good mechanical strength after bonding, compatible with subsequent methods such as Smart Cut™ and/or any method generating mechanical stresses on the assembly, such as for example mechanical thinning. In addition, this method does not affect the adhesion energy since the use of a cationic aqueous solution is only carried out after the surfaces have been brought into direct contact. For example, the bonding wave always propagates in 9 seconds for silicon substrates of about 200 mm.

The post-bonding heat treatment is also known to those skilled in the art as «bonding annealing».

According to a possibility, the heat treatment according to step d) is carried out by a rise in temperature, from ambient temperature to a final temperature, the rise in temperature being carried out over a period of a few hours, for example 2 hours for a final temperature of 300° C.

According to an arrangement, the temperature of the heat treatment applied in step d) is comprised between 100° C. and 300° C., in particular between 150° C. and 250° C.

According to an arrangement, the placing step c) of the direct bonding interface in the cationic aqueous solution is carried out for a period of approximately 5 min to 40 days.

The duration of this step increases with the diameter of the first and of the second substrate. It is indeed necessary that the cationic species have time to move over the entire direct bonding interface to obtain a homogeneous and uniform bonding energy. Also, the larger the diameter of the multilayer structure, the longer the duration of step c).

Also, step c) consists in immersing at least the direct bonding interface in said cationic aqueous solution. In other words, the multilayer assembly obtained in step b) is totally or partially immersed in the cationic aqueous solution insofar as the direct bonding interface is immersed in said cationic aqueous solution.

According to a possibility, the first bonding surface and/or the second bonding surface is formed at least in part by a hydrophilic film made of a material selected from a native oxide, a thermal or deposited silicon oxide, a silicon nitride, a copper oxide and a combination of these materials.

Typically, the hydrophilic copper oxide film is a hybrid film composed of copper pads separated by $SiO2$. The copper pads are covered almost instantly in the air with a native copper oxide.

When the hydrophilic film is made of oxide, it is for example formed by a deposited oxide, a thin oxide film obtained by a heat treatment (also called thermal oxide) and/or a thin oxide film obtained by a chemical treatment (also called native oxide or chemical oxide).

According to a variant, the first and/or the second substrate are made of oxidized material(s), such as alumina, so that the first bonding surface and/or the second bonding surface are formed by the material respectively of the first and/or of the second substrate because it is an intrinsically hydrophilic material. This does not preclude the presence of an additional hydrophilic film.

According to a particular embodiment, the first bonding surface is hydrophobic (for example in hydrophobic silicon obtained by passivation of the silicon surface and hydrogen grafting onto the silicon) and the second bonding surface is hydrophilic. The second bonding surface is formed at least in part by a hydrophilic film selected from a native oxide (of silicon, Ge, etc. depending on the material of the second substrate), a thermal oxide (of silicon), a deposited oxide, a nitride of silicon, a copper oxide and a combination of these compounds, or else the second bonding surface consists of the material of the second substrate which is an oxide and therefore hydrophilic. Bringing the second hydrophilic surface into contact with the hydrophobic surface changes the initial hydrophobic character of the latter into a hydrophilic character, which allows the direct bonding.

According to an arrangement, the first bonding surface and the second bonding surface are totally flat. In other words, the first and the second bonding surface are devoid of recess or patterns forming plates on a microscopic scale.

According to a particular implementation mode, the first bonding surface and/or the second bonding surface are cleaned by a treatment with ozonated water and/or an SC1 treatment and/or an SC2 treatment before step b).

According to a possibility, the first substrate and the second substrate have a diameter strictly greater than 2.5 cm.

Advantageously, step a) further comprises the drying of the first bonding surface and the second bonding surface before carrying out the contacting step b). After drying, the first bonding surface and the second bonding surface each have a face on which there resides at most one to five monatomic layers of $H_2O$, such that the first bonding surface and the second bonding surface are dry on a macroscopic scale.

According to an arrangement, the cationic aqueous solution comprises cationic species selected from $Na^+$, $Mg^{2+}$, $Ca^{2+}$, $K^+$, $Ba^{2+}$ and a mixture of these cationic species.

Concretely, the cationic aqueous solution is formed, by dissolving in deionized water, a salt selected from NaCl, $MgCl_2$, $CaCl_2$, KCl, $BaCl_2$, NaF, KCl, KF and a mixture of these compounds.

According to a possibility, the cationic aqueous solution has a mass concentration of the cationic species comprised between $10^{-8}$ g/ml and 0.5 g/ml, in particular between $10^{-8}$ g/ml and $10^{-2}$ g/ml and in particular between $10^{-8}$ g/ml and $10^{-4}$ g/ml. A low concentration of cations is sufficient to ensure strong bonding, which allows an inexpensive step. A higher concentration leads to poorer results.

According to an arrangement, the first substrate and the second substrate are each formed by a material selected from semiconductor materials, such as silicon, silicon oxides, silicon nitrides, SiOC, alumina, diamond, and a combination of these materials, even LNO (acronym for lanthanum nickel oxide $LaNiO3$), LTO (acronym for lithium titanate $Li2TiO3$) germanium, germanium oxide, SiC, InP, AsGa, GaN and a combination of these materials.

The first substrate and the second substrate can be of identical nature or of different nature.

According to an embodiment, the first substrate and the second substrate provided in step a) each comprise a silicon substrate having a diameter comprised between 100 mm and 300 mm, in particular 200 mm, and the first bonding surface and the second bonding surface are each formed by a silicon oxide film of 145 nm for example, step c) comprises the arrangement of the direct bonding interface, obtained in step b), in the cationic aqueous solution over a period comprised between 15 and 20 days for first and second substrates 200 mm, the cationic aqueous solution being a solution formed by dissolving NaCl in deionized water so as to reach a mass concentration comprised between $10^{-8}$ g/ml and 0.001 g/ml and for example approximately $10^{-4}$ g/ml, and step d) comprises the application of a heat treatment at approximately 300° C., so as to obtain direct bonding between the first substrate and the second substrate having a bonding energy greater than 5 $J/m^2$.

The bonding energy is measured for example with the double lever method with imposed displacement in an anhydrous atmosphere as described in the article by F. Fournel, L. Continni, C. Morales, J. Da Fonseca, H. Moriceau, F. Rieutord, A. Barthelemy, and I. Radu, Journal of Applied Physics 111, 104907 (2012).

According to a variant, the first substrate provided in step a) comprises one or more first vignettes originating from the vignetting of the first substrate so as to obtain a direct bonding of one or more first vignettes to the second substrate.

The first bonding surface is bounded by the exposed face of one or more first vignettes.

According to another variant, the second substrate provided in step a) comprises one or more second vignettes originating from the vignetting of the second substrate so as to obtain direct bonding between one or more first vignettes and one or more second vignettes.

The second bonding surface is bounded by the exposed side of one or more second vignettes.

According to other characteristics, the method for manufacturing the multilayer structure of the invention comprises one or more of the following optional characteristics considered alone or in combination:

The first substrate and/or the second substrate have a thickness greater than 50 micrometers, preferably greater than 100 micrometers, and for example a thickness of about 725 micrometers. The first substrate and/or the second substrate can be sufficiently thick layers to be self-supporting.

The first substrate and the second substrate are stacks of at least two layers of material of different nature.

The first bonding surface and the second bonding surface respectively of the first and the second substrate are each formed at least in part by a hydrophilic film of a native oxide, a silicon oxide, a silicon nitride, a copper oxide.

The first bonding surface and the second bonding surface respectively of the first and of the second substrate are each completely formed of a continuous hydrophilic film of a native oxide, a silicon oxide, a silicon nitride or a copper oxide and a combination of these materials.

Only the first bonding surface or the second bonding surface is hydrophilic, at the contacting time.

The first substrate and/or the second substrate comprise recesses opening out respectively to the first and/or the second bonding surface.

The first bonding surface and the second bonding surface are devoid of any material added before the contacting in step b).

The method comprises before step b) of contacting the bonding surfaces, a step consisting in applying a plasma treatment to the bonding surfaces of the first and second substrates. It is thus possible to substantially reduce the temperature of the thermal budget while maintaining a high bonding energy.

The drying of the first bonding surface and of the second bonding surface comprises a centrifugation of the first and second substrates, in particular at 2000 revolutions/min for 45 s.

The drying of the first bonding surface and the second bonding surface comprises a drying using the Marangoni effect.

The step c) of arrangement of at least the direct bonding interface is carried out in a cationic aqueous solution having a temperature comprised between the ambient temperature and 100° C.

The cationic aqueous solution comprises cationic species selected from Li, Rb, Sr, Cs and a mixture of these species.

The cationic aqueous solution is formed, by dissolving in deionized water, a salt selected from LiCl, RbCl, $SrCl_2$, CsCl and a mixture of these salts.

The first substrate and the second substrate provided in step a) each comprise a silicon substrate having a diameter comprised between 50 mm and 300 mm, for example between 100 mm and 250 mm, in particular 200 mm, and the first bonding surface and the second bonding surface are each formed by a film of silicon oxide, the step c) comprises placing the direct bonding interface, obtained in step b), in the cationic aqueous solution over a period comprised between 1 and 40 days, in particular the cationic aqueous solution comprises $Na^+$ cations and has a mass concentration comprised between $10^{-8}$ g/ml and 0.01 g/ml in particular between $10^{-8}$ g/ml and 0.001 g/ml and for example $10^{-4}$ g/ml, and step d) comprises the application of a heat treatment at 300° C., so as to obtain direct bonding between the first substrate and the second substrate, the direct bonding with a bonding energy greater than 5 $J/m^2$.

The first and the second substrate have a diameter of 50 mm and the duration of step c) is comprised between approximately 1 and 2 days.

The first and the second substrate have a diameter of 100 mm and the duration of step c) is comprised between approximately 4 to 6 days.

The first and the second substrate have a diameter of 200 mm and the duration of step c) is comprised between approximately 15 and 20 days.

The first and the second substrate have a diameter of 300 mm and the duration of step c) is comprised between about 35 to 40 days.

Other aspects, aims and advantages of the present invention will appear better on reading the following description of several embodiments thereof, given by way of non-limiting example and made with reference to the appended drawings. In the remainder of the description, for the sake of simplification, identical, similar or equivalent elements of the different embodiments bear the same reference numerals.

The figures do not necessarily respect the scale of all the elements represented so as to improve their readability and in which.

Figure 1:
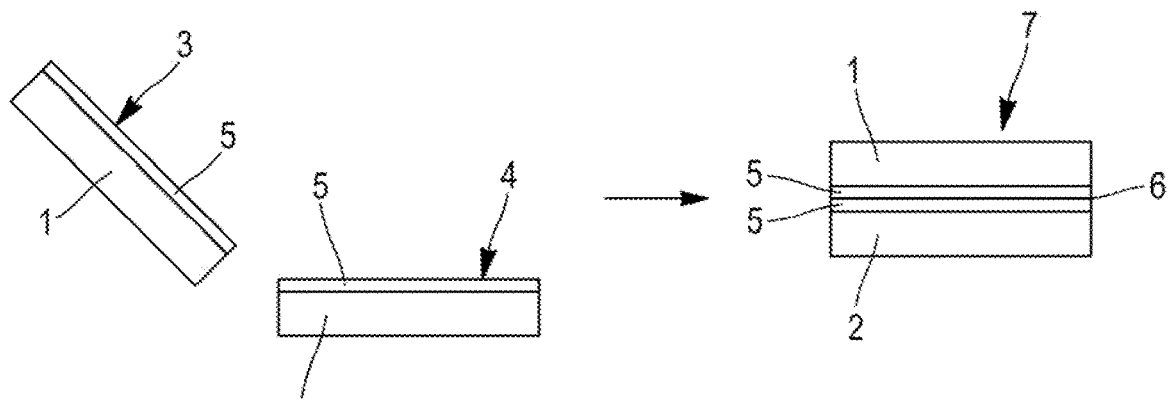
FIG. 1 represents a schematic view of steps a) and b) of the method according to one embodiment of the invention.
Figure 2:
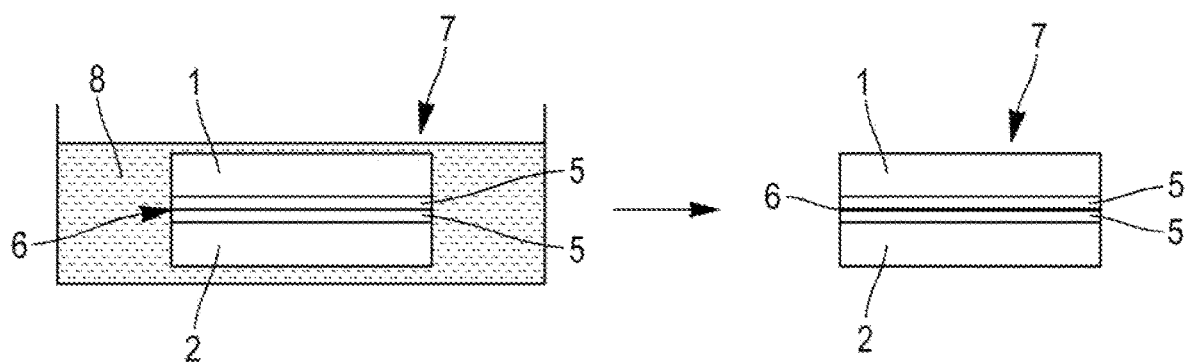
FIG. 2 represents a schematic view of step c) of the method according to the embodiment of the invention.
Figure 3:
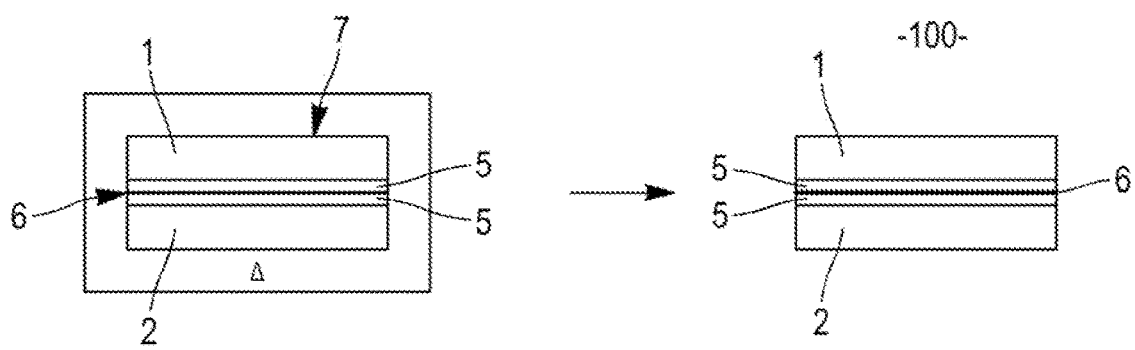
FIG. 3 represents a schematic view of step d) of the method according to the embodiment of the invention.

As illustrated in FIGS. 1 to 3, the method of the present invention proposes a direct bonding method between a first and a second substrate 1, 2 comprising an immersion step c) in an aqueous cationic solution followed by a bonding annealing step d) at low temperature which makes it possible to achieve high bonding energy.

A first substrate 1 and a second substrate 2, both made of silicon and each having a totally flat bonding surface 3, 4 over a diameter of 200 mm, are provided according to step a) of the method. As visible in FIG. 1, the first bonding surface 3 and the second bonding surface 4 are formed by a hydrophilic film 5 of silicon oxide (thermal or deposited) about 145 nm thick. Before the contacting step b), the method comprises cleaning with ozonated water of the two bonding surfaces 3, 4 and/or an SC1 treatment (mixture of 30% ammonia, 30% hydrogen peroxide and of deionized water in the respective volume proportions 1:1:5) and/or an SC2 treatment (mixture of 30% hydrochloric acid, 30% hydrogen peroxide and water in the respective volume proportions 1:1:5) so as to remove organic and particulate contaminants which are very detrimental to direct bonding. The two surfaces 3 and 4 are then brought into contact so as to create a direct bonding interface 6 between the two substrates 1, 2. According to a non-visible possibility, only one of the two bonding surfaces 3, 4 is formed by a film 5 of silicon oxide. According to yet another possibility not illustrated, a step of preparing the first and second bonding surfaces 3, 4 before the contacting of step b) comprises a plasma treatment. In all cases, the first and second bonding surfaces 3, 4 are dried before the contacting step b), so as to remove the water present on the macroscopic scale, for example by centrifugation at 2000 revolutions/min to obtain spontaneous direct bonding.

A cationic aqueous solution 8 is then prepared by dissolving NaCl in deionized water until a concentration of $10^{-4}$ g/ml in cationic species is reached. As illustrated in FIG. 2, the direct bonding interface 6 (here the entire assembly 7 obtained in step b) is then immersed in this solution 8 according to step c) of the method. The immersion is carried out over a period of approximately 20 days so that the cationic species have time to migrate over the entire direct bonding interface 6. This period is shorter when the substrates 1, 2 have a lower diameter. According to a non-illustrated variant, the first substrate and/or the second substrate 1, 2 comprise recesses opening out respectively to the first and/or the second surface of 3, 4, creating cavities at the direct bonding interface 6. The migration of the cationic species to the bonding interface 6 is then faster in this case and the duration of the immersion in the cationic aqueous solution 8 can be reduced.

A bonding annealing is carried out on the assembly 7 until a temperature of 300° C. is reached according to step d) of the method (FIG. 3). At the end of this heat treatment, the measurement of the bonding energy (double lever method) carried out on the multilayer structure 100 thus obtained leads to the breakage of the silicon substrates 1, 2 and not to the detachment of the substrates 1, 2 at the direct bonding interface 6. This indicates that the reached bonding energy is greater than the breaking energy of the silicon, namely a bonding energy greater than 5 J/m². The same method carried out without step c) of immersion in a cationic aqueous solution 8 leads to a bonding energy of 3 J/m² measured using the same double lever method, after a bonding annealing at 500° C.

According to a non-illustrated alternative, one of the two substrates 1, 2 provided in step a) has an embrittlement plane. The bonding annealing heat treatment contributes to the thermal budget allowing a fracture at the level of the embrittlement plane. The obtained multilayer structure 100 then comprises one of the two substrates 1, 2 bonded to a transferred thin layer originating from the fracture and a negative of the other of the substrates 1, 2.

According to yet another non-illustrated variant, the first substrate 1 provided in step a) is vignetted in several first vignettes, whose exposed faces are first bonding surfaces 3. The first vignettes are bonded according to the method previously described on the second substrate 2 (full plate) according to a «chip to wafer» bonding. According to yet another non-illustrated variant, the second substrate 2 is also vignetted in several second vignettes and the method of the invention allows the direct bonding of the first vignettes and the second vignettes.

According to a non-illustrated alternative, the first bonding surface 3 and the second bonding surface 4 are prepared so as to have hybrid copper-oxide bondable surfaces in direct bonding. These first and second hydrophilic bonding surfaces 3, 4 are typically composed of copper pads with sides of 2.5 micrometers separated by 2.5 micrometers of SiO2. It is then a hybrid surface with a «pitch» of 5 micrometers. Then steps b) to d) of the method are reproduced as previously described.

Thus, the present invention proposes a method for manufacturing a multilayer structure 100 comprising direct bonding between two substrates 1, 2 having a high bonding energy, and making it possible to limit the temperature of the post-bonding thermal annealing. The cationic aqueous solution is inexpensive and the immersion step c) is applicable to many materials. It is in particular possible to bond substrates (or thick layers) of materials having a significant difference in thermal expansion coefficient. Moreover, when the materials of the first and second substrates 1, 2 include devices, these are not damaged by the used temperatures.

It goes without saying that the invention is not limited to the variants described above by way of example but that it comprises all the technical equivalents and the variants of the means described as well as their combinations.

The invention claimed is:

1. A method for manufacturing a multilayer structure by direct bonding between a first substrate and a second substrate, the method comprising the steps of:
    a) providing a first substrate and a second substrate respectively comprising a first bonding surface and a second bonding surface,
    b) bringing the first bonding surface and the second bonding surface into contact so as to create a direct bonding interface between the first substrate and the second substrate,
    c) placing at least the direct bonding interface in a cationic aqueous solution comprising deionized water and cationic species originating from at least one element of the first and/or of the second column of the periodic table of elements, and
    d) applying a heat treatment at a temperature between 20° C. and 350° C. so as to obtain the multilayer structure wherein the first bonding surface and/or the second bonding surface is formed at least in part by a hydrophilic film made of a material selected from a native oxide, a thermal or deposited silicon oxide, a silicon nitride, a copper oxide and a combination of these materials.

2. The manufacturing method according to claim 1, wherein step c) of placing the direct bonding interface in the cationic aqueous solution is carried out for a period of approximately 5 min to 45 days.

3. The manufacturing method according to claim 1, wherein the first bonding surface and the second bonding surface are completely flat.

4. The manufacturing method according to claim 1, wherein the first bonding surface and/or the second bonding surface are cleaned by treatment with ozonated water and/or a SC1 treatment and/or a SC2 treatment before step b).

5. The manufacturing method according to claim 1, wherein the cationic aqueous solution comprises cationic species selected from $Na^+$, $Mg^{2+}$, $Ca^{2+}$, $K^+$, $Ba^{2+}$ and a mixture of these cationic species.

6. The manufacturing method according to claim 1, wherein the cationic aqueous solution is formed, by dissolving in deionized water, a salt selected from NaCl, $MgCl_2$, $CaCl_2$, KCl, $BaCl_2$, NaF, KCl, KF and a mixture of these compounds.

7. The manufacturing method according to claim 1, wherein the cationic aqueous solution has a mass concentration of the cationic species comprised between $10^{-8}$ g/ml and 0.5 g/ml.

8. The manufacturing method according to claim 1, wherein the first substrate and the second substrate are each formed by a material selected from semiconductor materials.

9. The manufacturing method according to claim 1, wherein:
    the first substrate and the second substrate provided in step a) each comprise a silicon substrate having a diameter comprised between 100 mm and 250 mm, and the first bonding surface and the second bonding surface are each formed by a film of silicon oxide,
    step c) comprises placing the direct bonding interface, obtained in step b), in the cationic aqueous solution over a period comprised between 15 and 20 days for first and second substrates of 200 mm, the cationic aqueous solution being a solution formed by dissolving NaCl in deionized water so as to reach a mass concentration comprised between $10^{-8}$ g/ml and 0.001 g/ml, and step d) comprises the application of a heat treatment at approximately 300° C., so as to obtain direct bonding between the first substrate and the second substrate having a bonding energy greater than 5 J/m$^2$.

* * * * *